(12) United States Patent
Gilchrist et al.

(10) Patent No.: US 11,881,378 B2
(45) Date of Patent: Jan. 23, 2024

(54) ANGLE CONTROL FOR NEUTRAL REACTIVE SPECIES GENERATED IN A PLASMA

(71) Applicant: Applied Materials, Inc., Santa Clara, CA (US)

(72) Inventors: Glen F. R. Gilchrist, Danvers, MA (US); Yufeng Qiu, Ithaca, NY (US)

(73) Assignee: Applied Materials, Inc.

( * ) Notice: Subject to any disclaimer, the term of this patent is extended or adjusted under 35 U.S.C. 154(b) by 0 days.

(21) Appl. No.: 17/743,965

(22) Filed: May 13, 2022

(65) Prior Publication Data

US 2023/0369013 A1 Nov. 16, 2023

(51) Int. Cl.
*H01J 37/30* (2006.01)
*H01J 37/305* (2006.01)

(52) U.S. Cl.
CPC ...... *H01J 37/3007* (2013.01); *H01J 37/3053* (2013.01); *H01J 2237/3151* (2013.01)

(58) Field of Classification Search
CPC ............. H01J 37/3007; H01J 37/32422; H01J 37/3053; H01J 2237/3341; H01J 2237/3151
See application file for complete search history.

(56) References Cited

U.S. PATENT DOCUMENTS 5,825,038 A * 10/1998 Blake .................. H01J 37/3007
250/492.21
10,141,161 B2 * 11/2018 Gilchrist ........... H01J 37/32422

| 2003/0168011 A1 | 9/2003 | Lee |
| 2008/0164819 A1 | 7/2008 | Hwang |
| 2016/0284520 A1 | 9/2016 | Likhanskii |
| 2018/0114676 A1 | 4/2018 | Kim |
| 2019/0164759 A1* | 5/2019 | Huang ............ H01L 21/823475 |
| 2019/0237292 A1 | 8/2019 | Park |

FOREIGN PATENT DOCUMENTS

| JP | 08077961 A | 3/1996 |
| KR | 20150085793 A | 7/2015 |
| WO | 2019125598 A1 | 6/2019 |
| WO | 2020117939 A1 | 6/2020 |

OTHER PUBLICATIONS

Written Opinion for the International Application No. PCT/US2023/021924, dated Sep. 5, 2023, 4 pages.
International Search Report and Written Opinion for the International Application No. PCT/US2023/021932, dated Sep. 5, 2023, 10 pages.

* cited by examiner

*Primary Examiner* — David E Smith
*Assistant Examiner* — Hsien C Tsai
(74) *Attorney, Agent, or Firm* — KDW Firm PLLC

(57) ABSTRACT

Provided herein are approaches for angle control of neutral reactive species ion beams. In one approach, a workpiece processing apparatus may include a plasma source operable to generate a plasma within a plasma chamber enclosed by a chamber housing, and an extraction plate coupled to the chamber housing. The extraction plate may include a plurality of channels for delivering one or more radical beams to a workpiece, wherein each of the plurality of channels has a lengthwise axis oriented at a non-zero angle relative to a perpendicular extending from a main surface of the workpiece, wherein each channel of the plurality of channels has a channel length and a channel width, and wherein the channel width varies along the channel length.

20 Claims, 9 Drawing Sheets

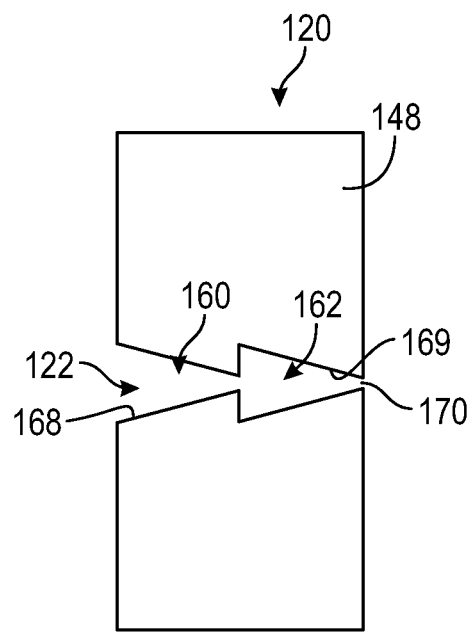 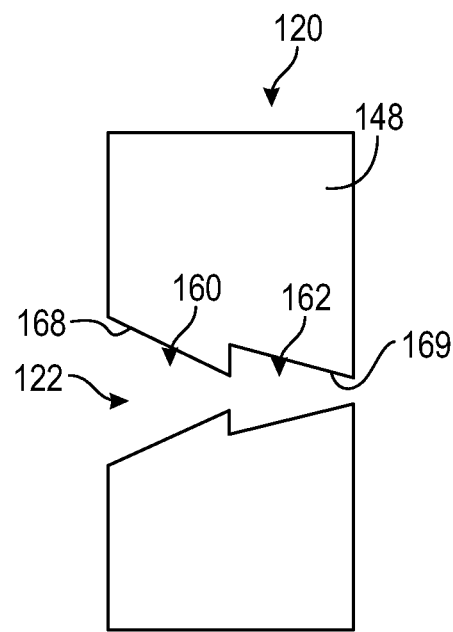
FIG. 4A  FIG. 4B
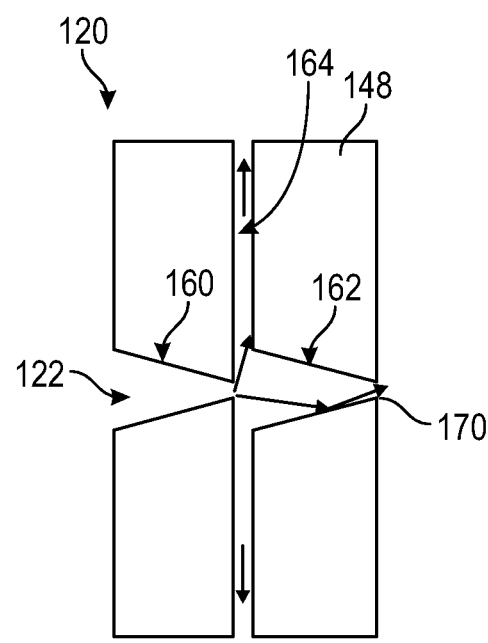 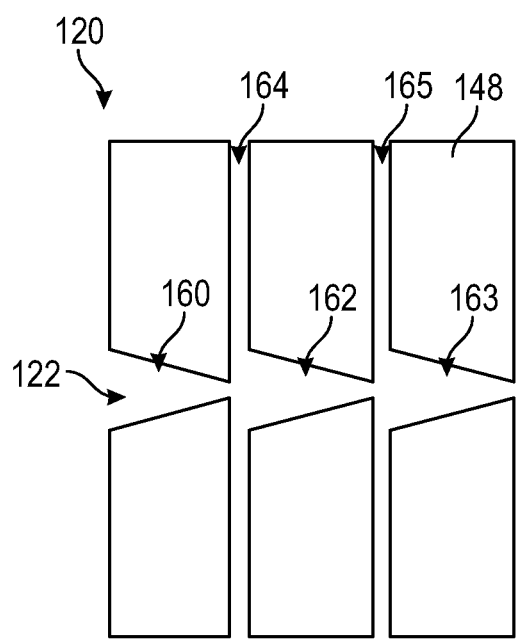
FIG. 4C  FIG. 4D

ANGLE CONTROL FOR NEUTRAL REACTIVE SPECIES GENERATED IN A PLASMA

FIELD OF THE DISCLOSURE

The disclosure relates generally to angle control for neutral reactive species ion beams, and more particularly, to an extraction plate including a plurality of channels for use in a directed reactive ion etch process.

BACKGROUND OF THE DISCLOSURE

Fabrication of advanced three-dimensional semiconductor structures with complex surface topology and high packing density presents many technical challenges. Patterning using extreme ultraviolet lithography (EUVL) typically results in printed features that do not match the designed features. For example, trenches or vias are typically shorter than desired, and the tip-to-tip distance is larger than desired, which results in incomplete overlap with vias or contact holes in layers above and below. This in turn results often results in high contact resistance or open circuit and device failure. EUVL double patterning is one current approach used to correct this problem, but EUVL tools are expensive and slow (e.g., as low as 1 hour per wafer per track), such that lithography is typically a bottle neck in wafer process flow.

Another problem encountered in EUVL patterning are bridge defects resulting from incomplete development of the EUV photoresist. Pattern correction and elimination of bridge defects in the EUV photoresist may be accomplished using an angled beam of reactive neutral species like oxygen radicals. However, precise angle control of reactive neutrals, generated in a plasma, is difficult to achieve. More specifically, reactive neutrals are not controllable using electrical fields. Therefore, while the angle of the charged ion beam may be more easily controlled, the same is not true for reactive neutrals. As the angles used for DRIE decrease (i.e., become closer to perpendicular to the workpiece), the lack of angular control of the reactive neutrals becomes more pronounced. Reactive neutrals are defined as those radicals/atoms which are highly reactive with some of the materials on the workpiece, but not others. For example, under the correct process conditions, chlorine has a high reaction rate with TiN, but a very low reaction rate with $SiO_2$. These reactive neutrals serve to etch portions of the workpiece, without affecting other parts. The inability to control the angle at which the reactive neutrals are directed toward the workpiece may compromise the speed of the etching process. In certain examples, the inability to control the angle at which the reactive neutrals are directed toward the workpiece may make it difficult to achieve the specified feature on the workpiece.

Therefore, it would be beneficial to control the angle and angular distribution (emittance) at which reactive neutrals are directed toward a workpiece. It is with respect to this and other considerations, the present disclosure is provided.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In one embodiment a workpiece processing apparatus may include a plasma source operable to generate a plasma within a plasma chamber enclosed by a chamber housing, and an extraction plate coupled to the chamber housing. The extraction plate may include a plurality of channels for delivering one or more radical beams to a workpiece, wherein each of the plurality of channels has a lengthwise axis oriented at a non-zero angle relative to a perpendicular extending from a main surface of the workpiece, wherein each channel of the plurality of channels has a channel length and a channel width, and wherein the channel width varies along the channel length.

In another embodiment, an extraction plate assembly coupled to a chamber housing of a plasma generator may include a main body having a first side positioned within the chamber housing and a second side positioned external to the chamber housing, and a plurality of channels extending through the main body. Each of the plurality of channels may have a lengthwise axis oriented at a non-zero angle relative to a perpendicular extending from a main surface of a workpiece, wherein the plurality of channels are operable to deliver one or more radical beams to the workpiece at the non-zero angle, wherein each channel of the plurality of channels has a channel length and a channel width, and wherein at least one channel of the plurality of channels has width that varies along the channel length.

In yet another embodiment, a method of controlling neutral reactive species may include generating a plasma within a plasma chamber of a plasma source, and coupling an extraction plate to the plasma chamber. The extraction plate may include a main body having a first side positioned within the chamber housing and a second side positioned external to the chamber housing, and a plurality of channels extending through the main body, wherein each of the plurality of channels has a lengthwise axis oriented at a non-zero angle relative to a perpendicular extending from a main surface of a workpiece. The method may further include delivering, through the plurality of channels of the extraction plate, one or more radical beams to the workpiece at the non-zero angle, wherein each channel of the plurality of channels has a channel length and a channel width, and wherein at least one channel of the plurality of channels has width that varies along the channel length.

BRIEF DESCRIPTION OF THE DRAWINGS

By way of example, embodiments of the disclosure will now be described, with reference to the accompanying drawings, in which:

FIGS. 4A-4I demonstrate various channels, according to embodiments of the present disclosure;

Figure 1:
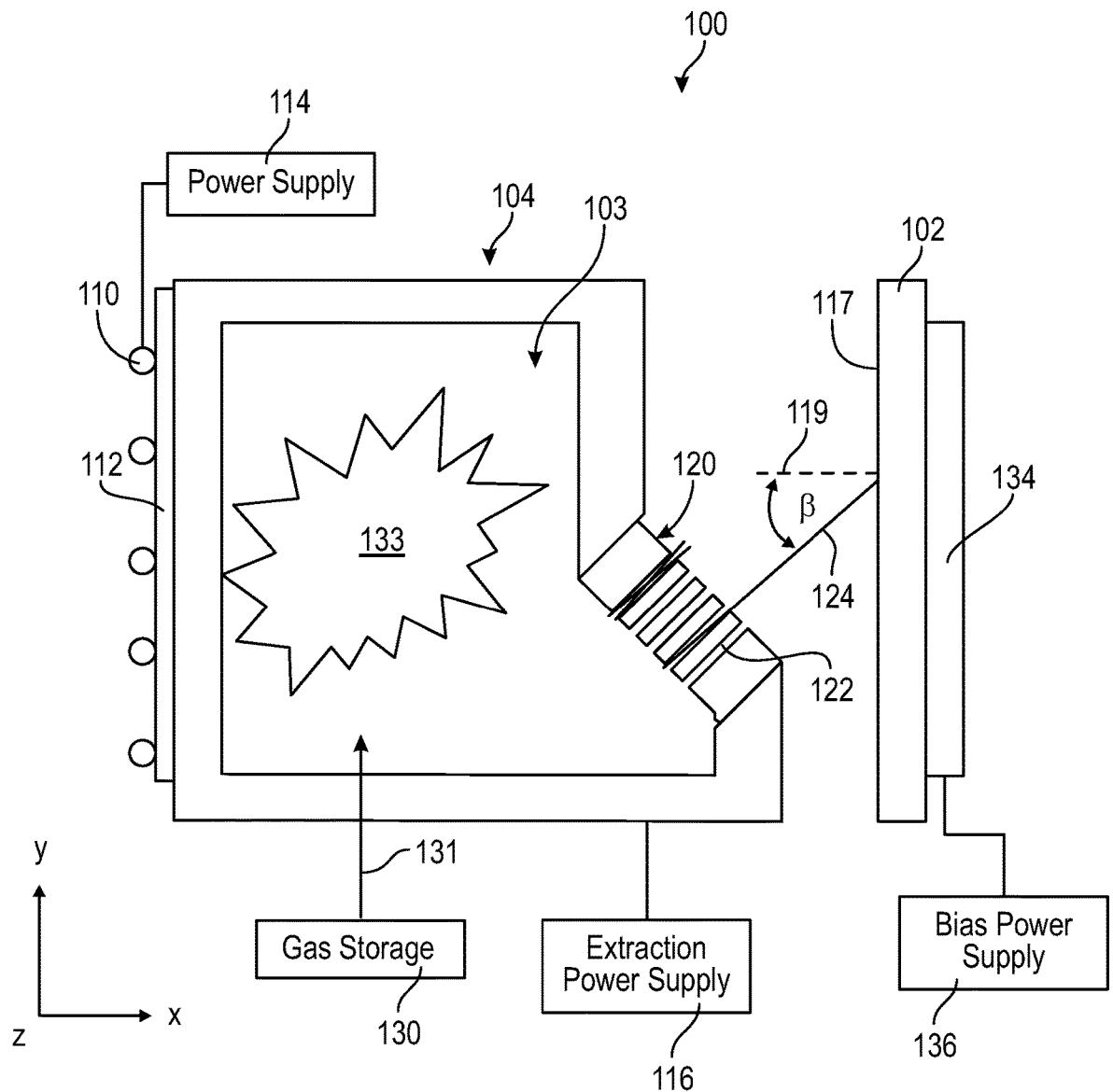
FIG. 1 is a schematic diagram of a system according to embodiments of the present disclosure.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

A plasma source including an extraction plate having a plurality of angled channels formed therein and methods in accordance with the present disclosure will now be described more fully hereinafter with reference to the accompanying drawings, where embodiments of the disclosure are shown. The extraction plate and methods of the disclosure may be described in many different forms and are not to be construed as being limited to the embodiments set forth herein. Instead, these embodiments are provided so this disclosure will be thorough and complete, and will fully convey the scope of the system and method to those skilled in the art.

In view of the foregoing deficiencies identified with the prior art, provided herein are approaches for generating a beam of neutral species including, but not limited to, reactive neutral species like O, H, F, Cl, etc., directed toward a workpiece at a specified angle and angular distribution. Embodiments herein achieve neutral species angle control using specially shaped channels of an extraction plate, the channels operable to reflect those species having trajectories outside of a specified angle range. These channels, when tilted with respect to the workpiece, such as a semiconductor 3D integrated circuit, provide a directional, angled neutral beam with low emittance. In one non-limiting application, the extraction plate may correct patterning defects of trenches in a EUV photoresist, such as bridge defects or incomplete trenches, using atoms directed parallel to the long axis of the trenches to elongate the trenches, reduce the bridge tip-to-tip distance, and thus provide better contact with lower contact resistance to layers above and below the EUV photoresist.

FIG. 1 shows a first embodiment of a workpiece processing apparatus 100 for controlling the angle at which ions and reactive neutrals are directed toward a workpiece 102. The workpiece processing apparatus 100 may include a plasma chamber 103 of a plasma source 104, the plasma chamber 103 being defined by a chamber housing 106. In some embodiments, an antenna 110 is disposed external to the plasma chamber 103, proximate a dielectric window 112. The dielectric window 112 may also form one of the walls that define the plasma chamber 103. The antenna 110 may be electrically connected to a power supply 114 (e.g., RF power supply), which supplies an alternating voltage to the antenna 110. Although non-limiting, the voltage may be at a frequency of, for example, 2 MHz or more. While the dielectric window 112 and antenna 110 are shown on one side of the plasma chamber 103, other embodiments are also possible. The chamber housing 106 may be made of a conductive material, such as graphite, and may be biased at an extraction voltage, such as by extraction power supply 116. The extraction voltage may be, for example, 1 kV. Other voltages are possible within the scope of the disclosure, however.

The workpiece processing apparatus 100 may further include an extraction plate 120 having a plurality of channels 122. The extraction plate 120 may form a portion of the chamber housing 106 defining the plasma chamber 103. Although non-limiting, the extraction plate 120 may be disposed on an opposite side of the plasma chamber 103 from the dielectric window 112. In certain embodiments, the extraction plate 120 may be constructed from an insulating material, such as quartz, sapphire, alumina or a similar insulating material. The use of an insulating material may allow recombination of radicals to form molecules, as will be described in greater detail herein. In other embodiments, the extraction plate 120 may be constructed of a conducting material. The extraction plate 120 may have a separate power supply (not shown) for increasing a temperature of the extraction plate 120 relative to the chamber housing 106 and/or the interior of the plasma chamber 103. In other embodiments the extraction plate 120 is not separately heated.

As shown, the workpiece 102 may be disposed proximate the extraction plate 120, outside the plasma chamber 103. In some embodiments, the extraction plate 120 may be oriented at a non-zero angle 'β' (e.g., approximately 45°) relative to a perpendicular 119 extending from a main surface 117 of the workpiece 102. As will be described in greater detail herein, the orientation of the extraction plate 120 and the plurality of channels 122 causes one or more radical beams 124 to impact the workpiece 102 at the non-zero angle (or within an acceptable +/− deviation amount from the non-zero angle). Throughout this disclosure, extraction angles are referenced to the perpendicular 119, which extends normal to a plane defined by the main surface 117 of the workpiece 102. Thus, an extraction angle of 0° refers to a path that is perpendicular to the main surface 117 of the workpiece 102, while an extraction angle of 90° is a path parallel to the main surface 117 of the workpiece 102. Emittance, or angular distribution, of the radical beams 124, refers to beam spread in and out of the page and up and down on this page that is in two axes orthogonal to the velocity vector of the radical beams, 124 (i.e., in the x, y-direction with respect to the workpiece 102).

In operation, the antenna 110 may be powered using a RF signal from the power supply 114 so as to inductively couple energy into the plasma chamber 103. This inductively coupled energy excites the feed gas introduced from a gas storage container 130 via a gas inlet 131, thus generating a plasma 133. While FIG. 1 shows antenna 110, it will be appreciated that other plasma generators may also be used with the present disclosure. For example, a capacitively coupled plasma generator may be used in other embodiments.

The plasma 133 within the plasma chamber 103 may be biased at the voltage being applied to the chamber housing 106 by the extraction power supply 116. The workpiece 102, which may be disposed on a platen 134, may be electrically biased by a bias power supply 136. The difference in potential between the plasma 133 and the workpiece 102 causes ions in the plasma 133 to be accelerated through the extraction plate 120 in the form of one or more ribbon ion beams and toward the workpiece 102. In other words, positive ions are attracted toward the workpiece 102 when the voltage applied by the extraction power supply 116 is more positive than the bias voltage applied by the bias power supply 136. Thus, to extract positive ions, the chamber housing 106 may be biased at a positive voltage, while the workpiece 102 is biased at a less positive voltage, ground or a negative voltage. In other embodiments, the chamber housing 106 may be grounded, while the workpiece 102 is biased at a negative voltage. In yet other embodiments, the chamber housing 106 may be biased at a negative voltage, while the workpiece 102 is biased at a more negative voltage. In yet another embodiment, both the chamber housing 106 and workpiece 102 may be grounded and ions generated in the plasma will have only thermal velocity, typically less than 1 eV.

Figure 2:
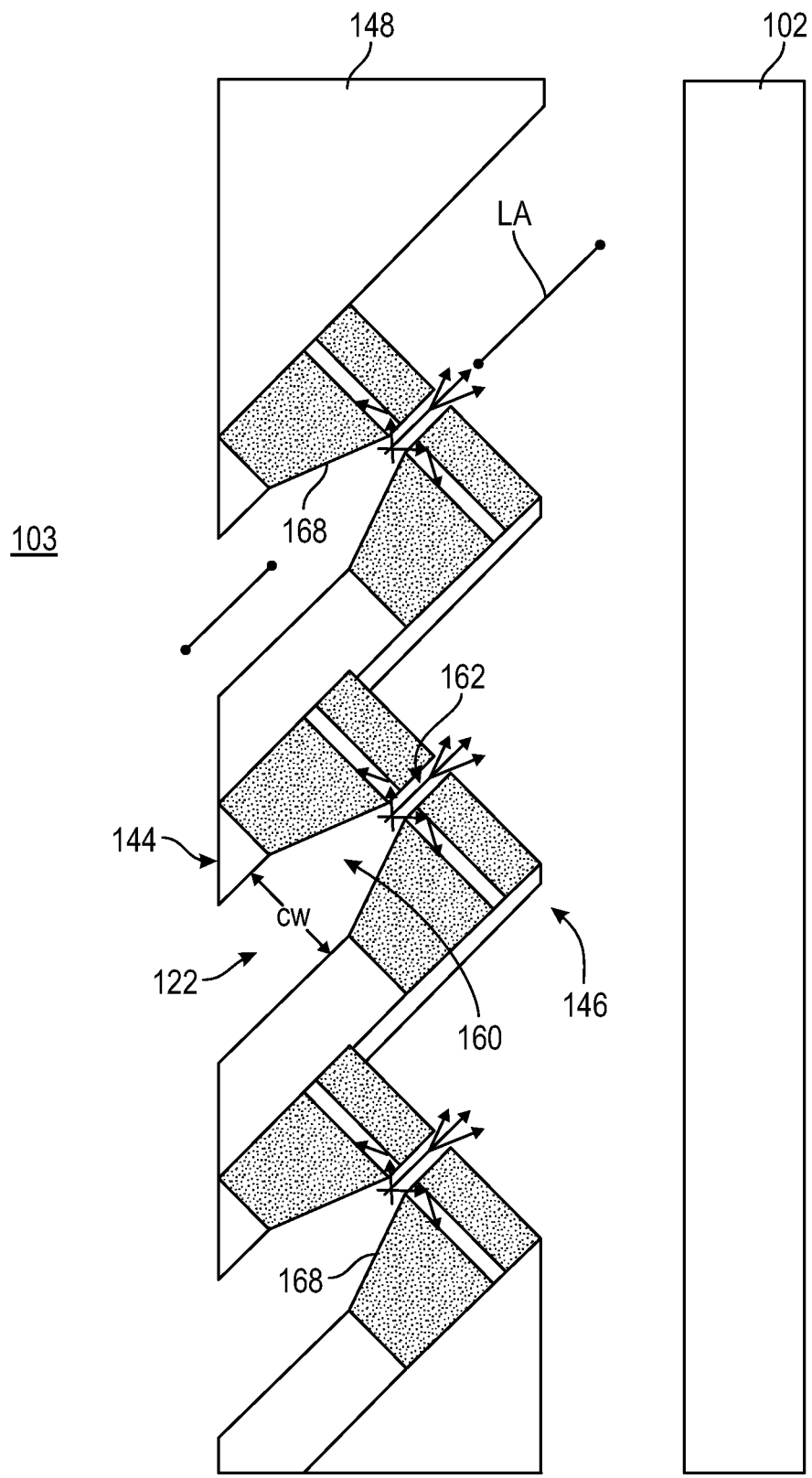
FIG. 2 demonstrates an extraction plate according to embodiments of the present disclosure.

Turning now to FIG. 2, a portion of the extraction plate 120 according to embodiments of the present disclosure will be describe in greater detail. The extraction plate 120 may include the plurality of channels 122 extending along a lengthwise axis 'LA', between a first side 144 and a second side 146 of a main body 148. The first side 144 of the main body 148 may be disposed within the plasma chamber 103, while the second side 146 may be disposed outside the plasma chamber 103. The channels 122 are operable to direct reactive neutral species like radicals and atoms including H, N, O and F and ions toward the workpiece 102 at a predetermined angle (e.g., 45°). In some examples, plasma sheath modulation and electric fields may be used to control the angle at which the charged ions exit the channels 122 along the second side 146. However, reactive neutrals are not affected by either of these mechanisms and therefore tend to leave the extraction channels 122 in a random manner. The reactive neutrals travel in straight lines until they collide with other particles or structure surfaces. For example, the reactive neutrals may collide with an inner sidewall or surface 168 of the channels 122 and/or with other ions or reactive neutrals. Depending on the angle of the radical velocity vector collisions between reactive neutrals including radicals and atoms and the inner surface 168, may result in reflection back into the plasma, transmission along the cross channels, and recombination to form molecules which are typically much less reactive or transmission through the channel toward the workpiece 102. Providing the channels 122 through the extraction plate 120 provides angular control for the reactive neutrals.

As shown, each of the channels 122 includes a channel length (e.g., along the lengthwise axis) between the first side 144 and the second side 146 of the main body 148, and a channel width 'CW', which may correspond to a diameter of the channel 122 in the case the channel has a circular profile. In some embodiments the channel width varies along the channel length. As will be described in greater detail herein, one or more of the channels 122 may include a first section 160 and a second section 162 proximate the second side 146 of the main body 148. The first section 160 may be defined by an angled inner surface 168. Between the first and second sections 160, 162 may be a cross channel 164, which extends generally perpendicular to the lengthwise axis. The cross channel 164 provides an exit path for radicals that travel outside of a specified angle range.

Figure 3C:
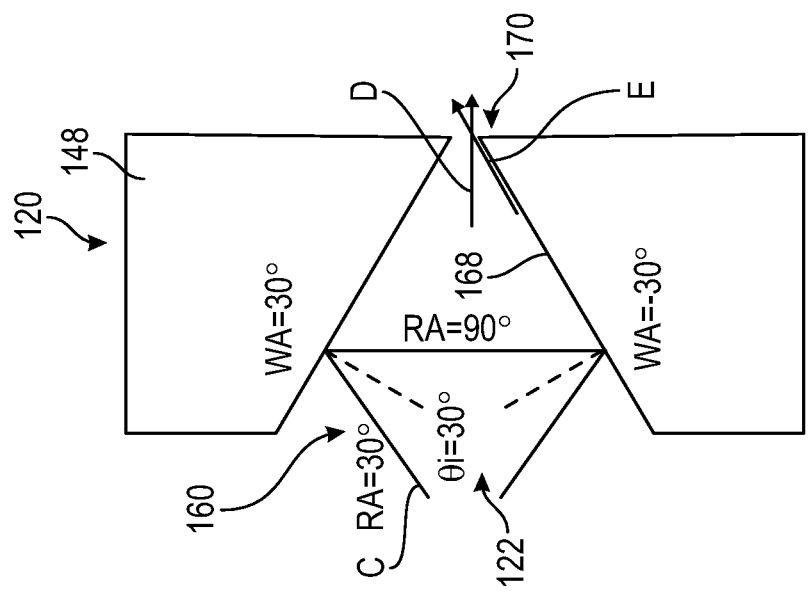
FIGS. 3A-3C demonstrate a channel of the extraction plate, according to embodiments of the present disclosure.
Figure 3B:
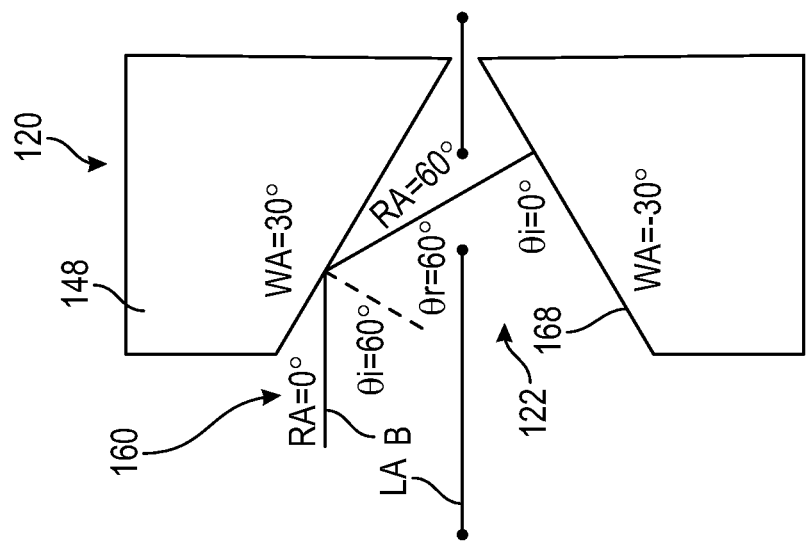
Figure 3A:
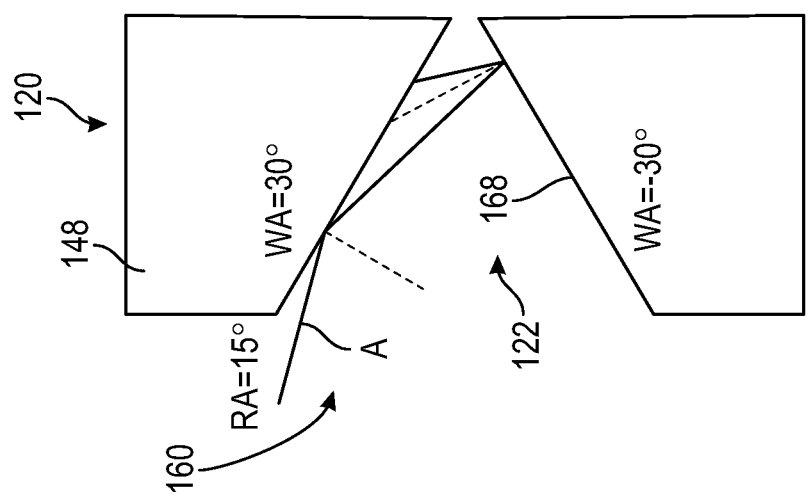

Turning now to FIGS. 3A-3C, radical behavior within an example channel 122 will be described in greater detail. In general, radicals will travel in straight lines at a given thermal velocity (e.g., 400-2000 m/s) until they collide with a molecule, atom, radical or surface. Single atom radicals like H, N, O, F and Cl, atoms like He, Ne and Ar, and small molecules like H2, N2 and O2, have elastic collisions with each other and specular reflection (angle of incidence, θi equals angle of ref lection θr) upon collision with surfaces. For example, radicals in FIG. 3A traveling along trajectory 'A' may have multiple collisions with the angled inner surface 168 of the first section 160 of the channel 122, depending on its entry position and elevation angle (e.g., 15° with respect to the lengthwise axis of the channel 122). Similarly, radicals in FIGS. 3B and 3C traveling along trajectories 'B' and 'C', respectively, have multiple collisions with the angled inner surface 168 of the first section 160 of the channel 122. Trajectory B may initially be offset yet parallel to the lengthwise axis, while trajectory C may initially be −30°. Trajectories A, B and C will all result in reflection back into the source plasma. Trajectories D and E are such that radicals may travel through an exit aperture 170 of the channel 122, as shown in FIG. 3C.

Figure 4E:
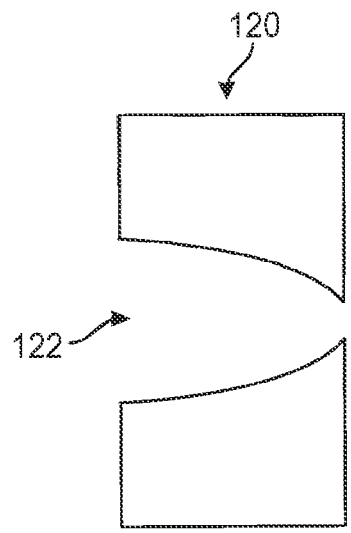

FIGS. 4A-4I demonstrate various possible channel geometries according to embodiments of the present disclosure. It will be appreciated that multiple, different channel geometries may be present within a same extraction plate 120 in some embodiments. FIG. 4A demonstrates the channel 122 through the main body 148, wherein the channel 122 includes the first section 160 connected with the second section 162. The first section 160 may have the angled inner surface 168 and the second sections 162 may have a second angled inner surface 169. More specifically, each of the first and second sections 160, 162 may be conically shaped, narrowing towards the exit aperture 170. FIG. 4B is similar to the channel 122 of FIG. 4A, except the angled inner surface 168 of the first section 160 extends at a greater angle relative to the lengthwise axis than the angled inner surface 169 of the second section 162. Said another way, a maximum width at the entrance of the first section 160 is greater than a maximum width at the entrance of the second section 162.

In FIG. 4C, the first section 160 and the second section 162 of the channel 122 are separated from one another by the cross channel 164. Each of the first and second sections 160, may be conically shaped, narrowing towards the exit aperture 170. FIG. 4D meanwhile, demonstrates channel 122 including a third section 163 separated from the second section 162 by a second cross channel 165. The third section 163 may have a same or different geometry than the first section 160 and/or the second section 162, and the second cross channel 165 may have a same or different geometry than the first cross channel 164.

Figure 4F:
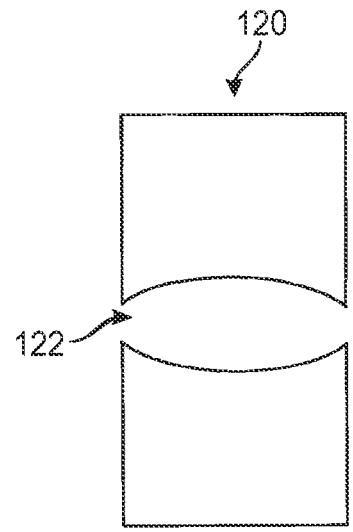
Figure 4G:
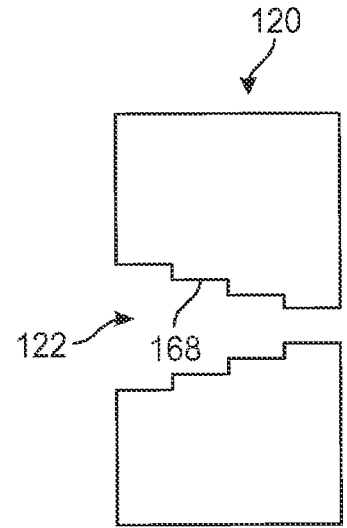
Figure 4H:
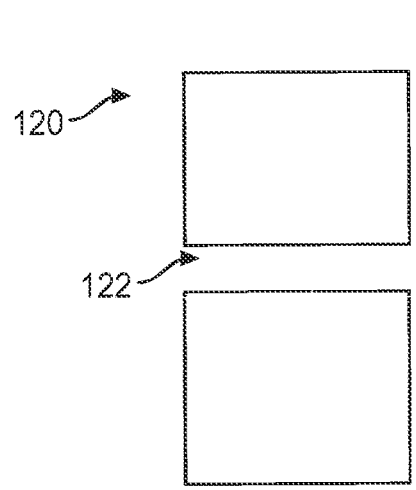
Figure 4I:
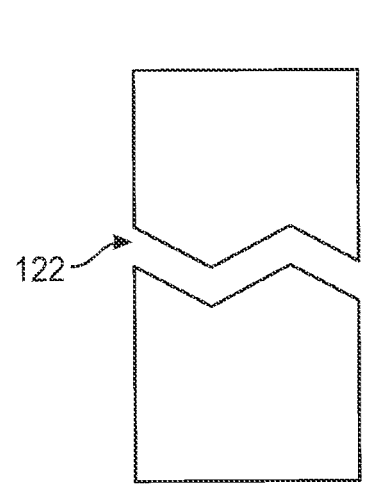

FIG. 4E and FIG. 4F each demonstrate a channel 122 having an elliptical cross-section, while FIG. 4G demonstrates channel 122 with a stepped inner surface 168. FIG. 4H demonstrates a substantially straight, cylindrical channel 122, while FIG. 4I demonstrates a zig-zag configuration for the channel 122. It will be appreciated that other configurations, dimensions, shapes, etc., may be possible for channel 122 in other embodiments.

Figure 5:
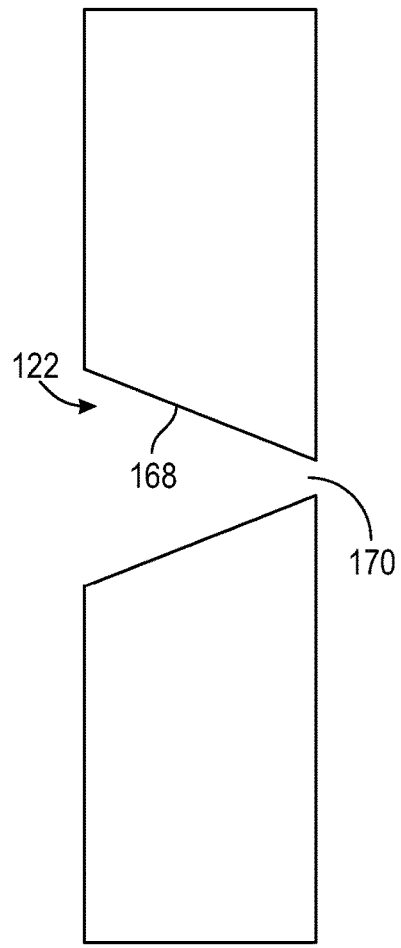
FIG. 5 demonstrates a channel of the extraction plate, according to embodiments of the present disclosure.
Figure 6:
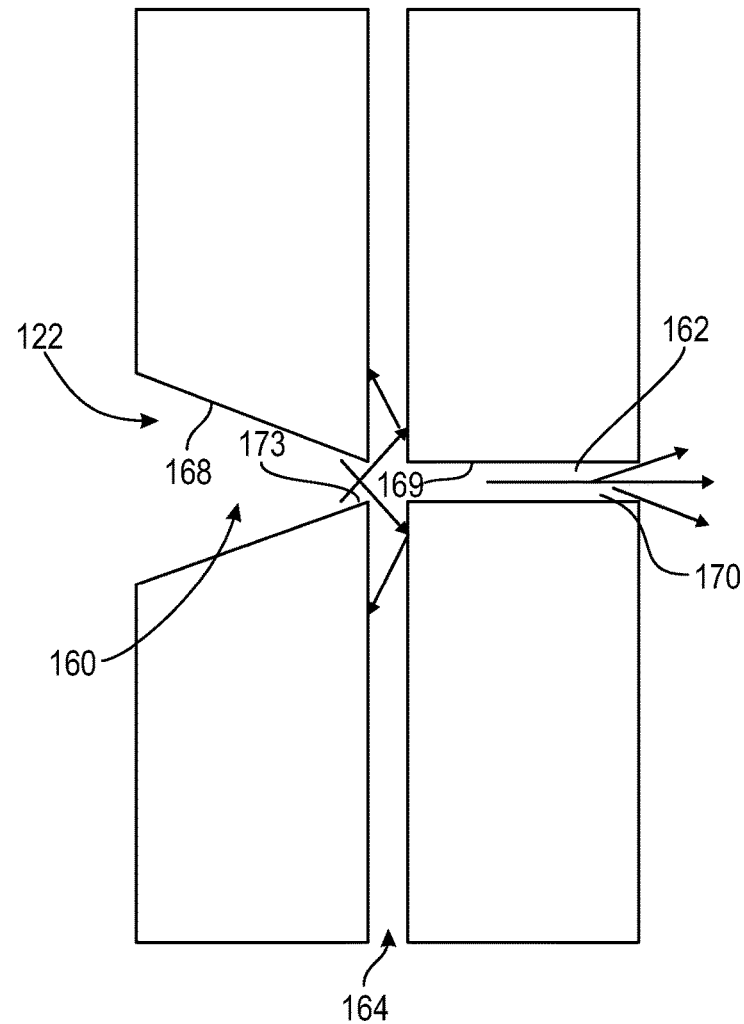
FIG. 6 demonstrates a channel of the extraction plate, according to embodiments of the present disclosure.

Referring to FIG. 5 and FIG. 6, further operation of example channels will be described. Atoms and diatomic molecules typically have elastic collisions with each other and specular reflection with surfaces. Computer simulations may be used to test angle filtering capabilities of differently shaped channels, wherein it is assumed that (1) there are no collision between radicals, and (2) radicals have specular reflection upon collisions with channel surfaces (such as angled inner surface 168 and/or angled inner surface 169) such that the angle of incidence equals the angle of emergence, and radicals can bounce infinity times without losing energy. It has been found that most radicals (e.g., >99.9%) will be either projected out of the channel 122 or back to the plasma source chamber within three (3) sidewall bounces. With the second assumption, initial radical velocities are not controlling; only radical trajectories are analyzed. When a radical collides with the inner surface 168, its angle will change following equation 1, below, in which α is the acute angle of incidence, β is the acute angle of emergence and AA is the angle of the cone.

$$\beta top = -AA - \alpha top \quad (1)$$

The corresponding trajectory gradiences can be calculated based on angles. For example, all the radicals may be calculated within a 2D plane of the cone of the channel 122. After the cone-shaped channel, based on different channel configurations, there might be the exit aperture 170, which has the function of filtering radicals. Only those radicals that can reach the aperture 170 will remain. Collision and angle changing in the aperture 170 were not considered because the input angle will either be the same or the compliment (reverse) as the output angle. Again, only those radicals that can reach the aperture 170 will remain.

In one example, 800 random positions were generated on the entrance line of the cone-shaped channel 122 in both FIG. 5 and FIG. 6. On each of those positions, 1250 radicals with random initial angles between −80° to 80° were generated. This range may be selected because the radicals will be bounced out of the cone if their initial angles is beyond that range. The total amount of simulated radicals is 1,000,000, which is enough to eliminate the influence of occasional fluctuation and to reflect the radical performance accurately. Channel 122 of FIG. 5 is conically shaped with a 60° apex angle and a 2 mm aperture 170 facing the wafer (not shown). FIG. 6 has a conically shaped first section 160, which is placed in series with the second section 162 (e.g., 2 mm diameter cylindrical channel) spaced 2 mm from an exit aperture 173 of the first section 160. As shown, channel 122 in FIG. 6 may further include cross channel 164.

Figure 7:
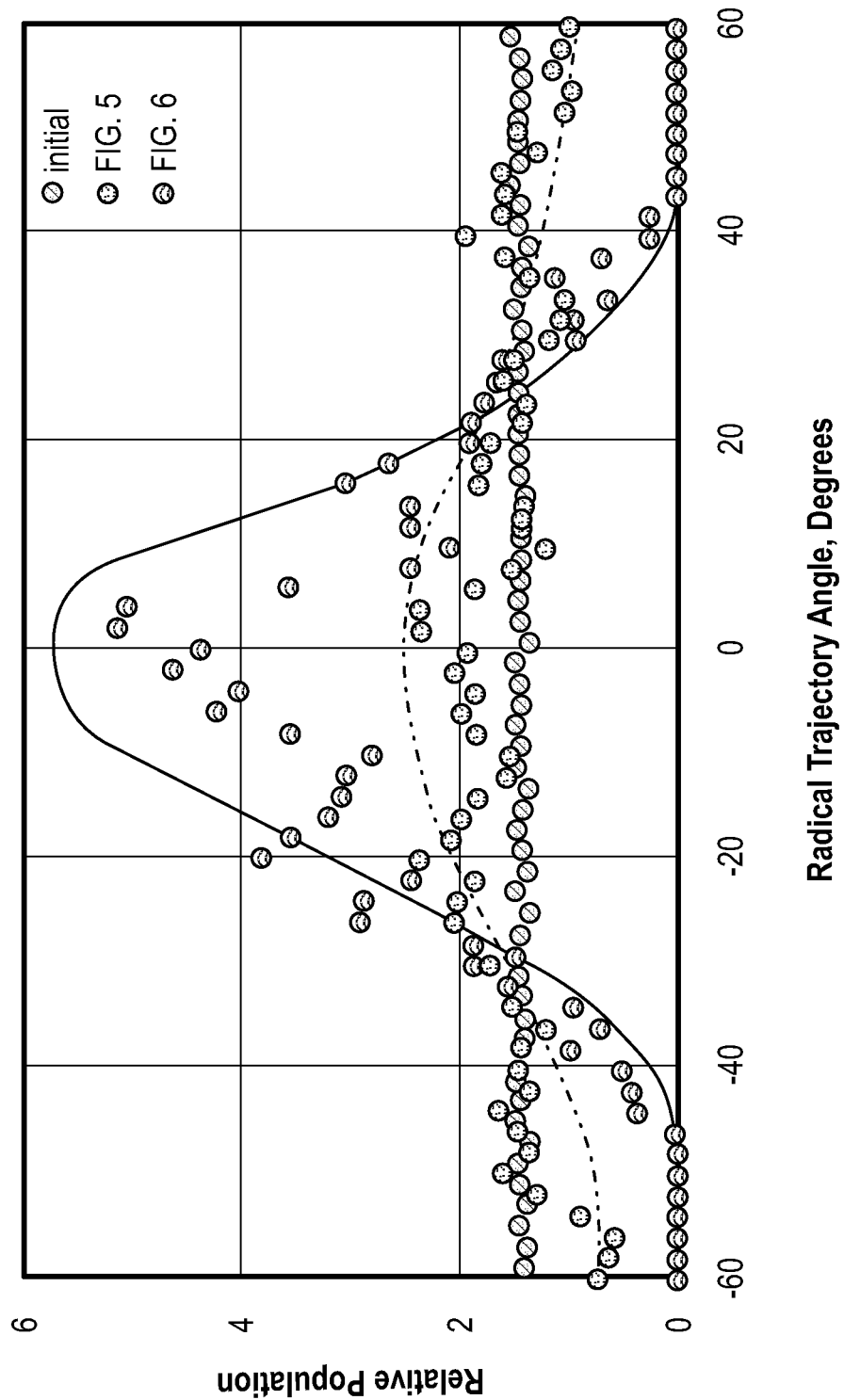
FIG. 7 is a graph illustrating input population vs. radical trajectory angle of radicals for the channels of FIG. 5 and FIG. 6, according to embodiments of the present disclosure.

FIG. 7 shows the input population vs. radical trajectory angle of radicals for the channels 122 of FIG. 5 and FIG. 6. Both channel designs have shifted the distribution of angles toward a lower angle, with the channel 122 of FIG. 6 having the greatest shift. In a practical application, the central lengthwise axis of the channel 122 would be tilted, at a specified angle, with respect to the wafer to achieve the desired angled, radical beam.

Figure 8A:
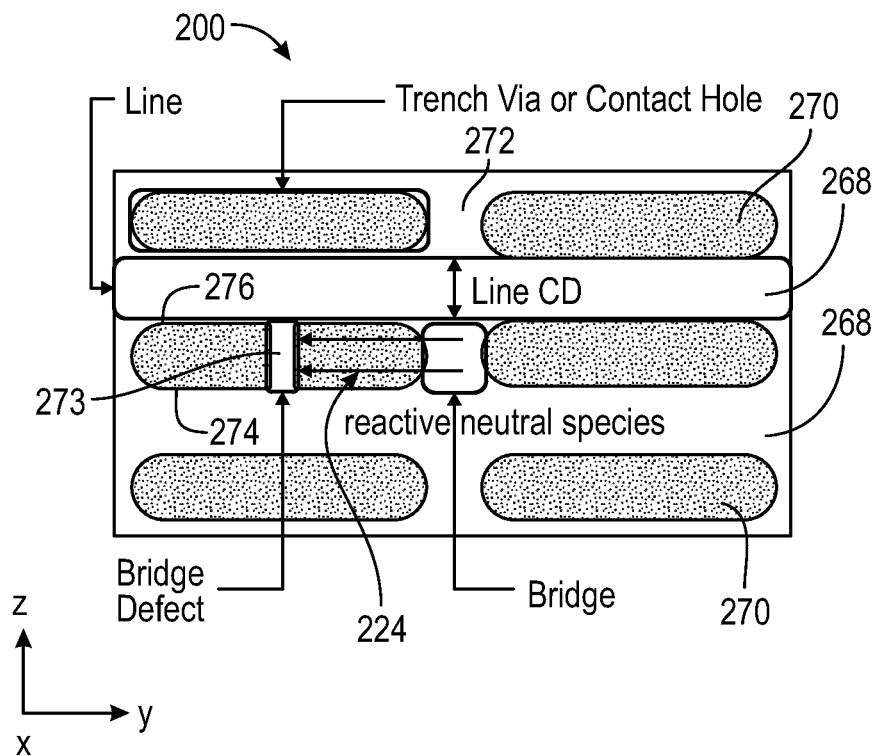
FIGS. 8A-8B depict an example reactive ion etch process, according to embodiments of the present disclosure.
Figure 8B:
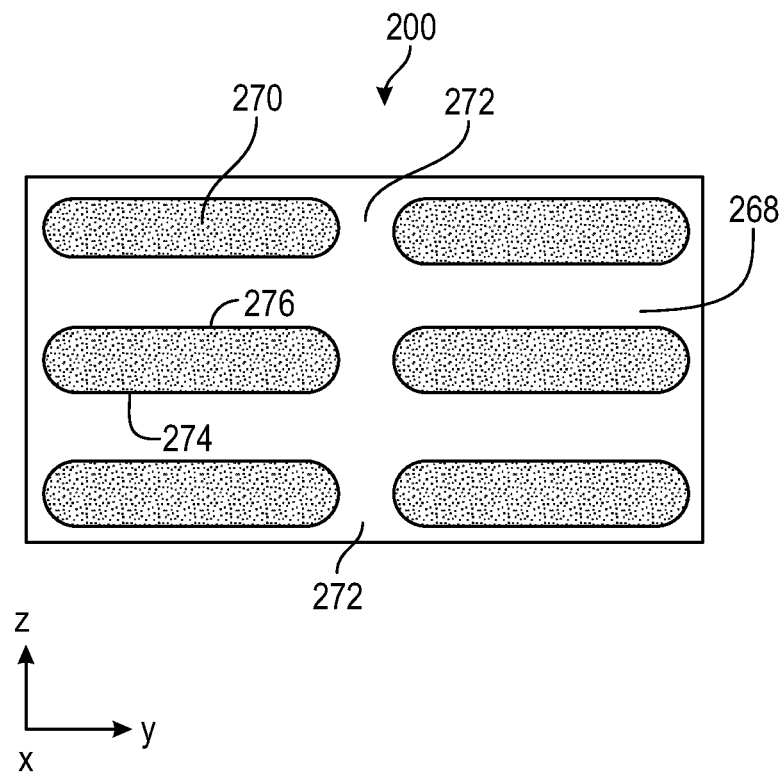

FIGS. 8A and 8B depict an example structure 200 including a series of lines 268 in between a plurality of trenches or openings 270. Although non-limiting, structure 200 may include an EUV photoresist, wherein bridges 272 are present between adjacent ends of the openings 270. A distance between sidewalls of adjacent openings 270 represents the line critical dimension (CD). In this example, one of the openings 270 may have a bridge defect 273 extending between opposite sidewalls 274, 276. To remove the bridge defect 273 without damaging or modifying other areas of the structure 200, a directed, angled beam of oxygen radicals 224 may be directed into a sidewall of the bridge defect 273, as shown in FIG. 8A. Using the channels 122 of the extraction plate 120 described herein, angular distribution (emittance) of the angled beam of oxygen radicals 224 is minimized/constrained. As a result, as shown in FIG. 8B, the bridge defect 273 may be removed with no line CD loss (e.g., in the z-direction) and no bridge 272 loss (e.g., in the y-direction). FIGS. 8A-8B represent one possible implementation of the embodiments of the present disclosure, namely, to generate a beam of neutral species, including reactive neutral species like O, H, F, Cl, etc., directed toward a workpiece at a specified angle and angular distribution. Embodiments herein achieve neutral species angle control with a specially shaped channels that reflect species having trajectories outside of the specified angle range.

Figure 9:
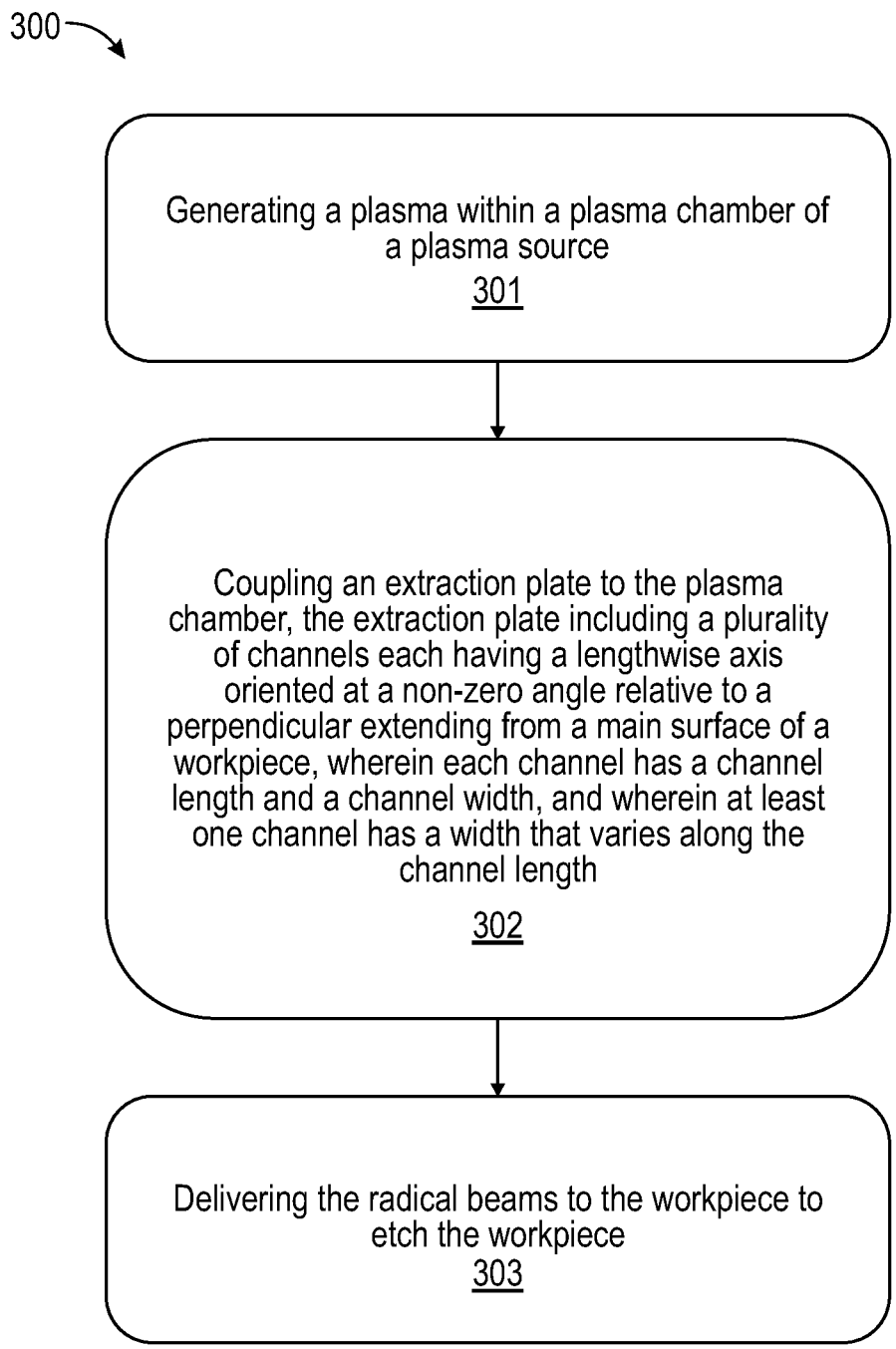
FIG. 9 is a flowchart depicting a method according to embodiments of the present disclosure.

Turning to FIG. 9, a method 300 according to embodiments of the disclosure will be described. At block 301, the method 300 may include generating a plasma within a plasma chamber of a plasma source. At block 302, the method 300 may include coupling an extraction plate to the plasma chamber, the extraction plate including a plurality of channels each having a lengthwise axis oriented at a non-zero angle relative to a perpendicular extending from a main surface of a workpiece, wherein each channel has a channel length and a channel width, and wherein at least one channel has width that varies along the channel length.

In some embodiments, the extraction plate is oriented at the non-zero angle, wherein the one or more radical beams include oxygen radicals. The non-zero angle may be between 30°–60°, preferably approximately 45°. In some embodiments, a ratio of channel length to channel width is greater than 5:1, preferably 10:1. In some embodiments, the extraction plate is made (in whole or part) from quartz, stainless steel, or aluminum.

In some embodiments, each channel of the plurality of channels has an entrance and an exit, wherein the channel width decreases from the entrance to the exit. In some embodiments, each channel of the plurality of channels has a first section and a second section, wherein the channel width of the first section varies. In some embodiments, the channel width of the second section is constant. In some embodiments, the channel width of the second section varies. In some embodiments, the first section is conically shaped, and wherein the second section is cylindrically shaped. In some embodiments, a maximum channel width of the first section is different than a maximum channel width of the second section. In some embodiments, one or more channels of the plurality of channels includes a cross channel extending perpendicular to the lengthwise axis.

At optional block 303, the method 300 may further include delivering the one or more radical beams to the workpiece to etch the workpiece. For example, the workpiece may include a 3D IC having one or more defects in a EUV photoresist layer. The angled radical beams may be used to more effectively correct the defects, such as a bridge defect.

In sum, embodiments herein provide an apparatus and method to direct a highly focused beam of radicals, at a specified angle with low angle spread, at a workpiece like a 3D semiconductor integrated circuit. Although examples described herein relate to an angled beam of oxygen radicals, directed at a 3D patterned layer of EUV PR, it will be appreciated that the approaches of the disclosure apply to virtually any reactive neutral gas phase species including, but not limited to, H, N, O, F, Cl, CF, CF2, CF3 and fluoroalkane radicals. It will be further appreciated that the approaches of the disclosure may apply to any substrate or layer that may be etched by these radicals, including but not limited to, EUV PR, SOH, CHM, $SiO_2$, SiON, Si3N4 and SiC.

Embodiments described herein may have many advantages. For example, directed reactive ion etching may be more effective and efficient when both ions and reactive neutrals contact the surface to be etched. The extraction angle of reactive neutrals may be precisely controlled through the use of neutral species channels in a manner that may not be possible using conventional techniques. This precise extraction angle control allows etching of densely packed features. In fact, in certain embodiments, the time to etch the sidewall of a trench may be reduced by an order of magnitude or more by being able to precisely direct the reactive neutrals to the desired locations.

Furthermore, unlike traditional RIE processes, embodiments of the present disclosure use a purely chemical process, with thermal radicals (e.g., oxygen atoms) having energy around 0.05 eV for which there is no sputtering, high (100:1) etch selectivity, and no equipment damage.

Still furthermore, embodiments of the disclosure offer a great deal of value because the angled extraction plate is compatible with some existing plasma source and process chamber enabling tools currently available in the 1D patterning and EUVL descum market. High beam angles)(>45°, which are desirable for 1D patterning and EUVL descum, may be achieved through channel design, material selection and temperature control, as described herein. Furthermore, since halides and fluoroalkanes are not required, for the case of EUV PR patterning, this configuration will have significantly lower bill of materials (BOM) cost since there is no need for etch resistant materials and there is no need for pulsed DC wafer bias, further eliminating more BOM cost.

The foregoing discussion has been presented for purposes of illustration and description and is not intended to limit the disclosure to the form or forms disclosed herein. For example, various features of the disclosure may be grouped together in one or more aspects, embodiments, or configurations for the purpose of streamlining the disclosure. However, it should be understood that various features of the certain aspects, embodiments, or configurations of the disclosure may be combined in alternate aspects, embodiments, or configurations. Moreover, the following claims are hereby incorporated into this Detailed Description by this reference, with each claim standing on its own as a separate embodiment of the present disclosure.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

All directional references (e.g., proximal, distal, upper, lower, upward, downward, left, right, lateral, longitudinal, front, back, top, bottom, above, below, vertical, horizontal, radial, axial, clockwise, and counterclockwise) are only used for identification purposes to aid the reader's understanding of the present disclosure, and do not create limitations, particularly as to the position, orientation, or use of this disclosure. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other.

Furthermore, identification references (e.g., primary, secondary, first, second, third, fourth, etc.) are not intended to connote importance or priority, but are used to distinguish one feature from another. The drawings are for purposes of illustration only and the dimensions, positions, order and relative sizes reflected in the drawings attached hereto may vary.

Still furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

What is claimed is:

1. A workpiece processing apparatus, comprising:
 a plasma source operable to generate a plasma within a plasma chamber enclosed by a chamber housing; and
 an extraction plate coupled to the chamber housing, wherein the extraction plate comprises a plurality of channels for delivering one or more radical beams to a workpiece, wherein each of the plurality of channels has a lengthwise axis oriented at a non-zero angle relative to a perpendicular extending from a main surface of the workpiece, wherein each channel of the plurality of channels has a channel length and a channel width, and wherein the channel width varies along the channel length.

2. The workpiece processing apparatus of claim 1, wherein each channel of the plurality of channels has an entrance and an exit, wherein the channel width decreases from the entrance to the exit.

3. The workpiece processing apparatus of claim 1, wherein each channel of the plurality of channels has a first section and a second section, wherein the channel width of the first section varies.

4. The workpiece processing apparatus of claim 3, wherein the channel width of the second section is constant.

5. The workpiece processing apparatus of claim 3, wherein the channel width of the second section varies.

6. The workpiece processing apparatus of claim 3, wherein the first section is conically shaped, and wherein the second section is cylindrically shaped.

7. The workpiece processing apparatus of claim 3, wherein a maximum channel width of the first section is different than a maximum channel width of the second section.

8. The workpiece processing apparatus of claim 1, wherein one or more channels of the plurality of channels comprises a cross channel extending perpendicular to the lengthwise axis.

9. An extraction plate assembly coupled to a chamber housing of a plasma generator, wherein the extraction plate comprises:
 a main body having a first side positioned within the chamber housing and a second side positioned external to the chamber housing; and
 a plurality of channels extending through the main body, wherein each of the plurality of channels has a lengthwise axis oriented at a non-zero angle relative to a perpendicular extending from a main surface of a workpiece, wherein the plurality of channels are operable to deliver one or more radical beams to the workpiece at the non-zero angle, wherein each channel of the plurality of channels has a channel length and a channel width, and wherein at least one channel of the plurality of channels has width that varies along the channel length.

10. The extraction plate assembly of claim 9, wherein each channel of the plurality of channels has an entrance and an exit, wherein the channel width decreases from the entrance to the exit.

11. The extraction plate assembly of claim 9, wherein each channel of the plurality of channels has a first section and a second section, wherein the channel width of the first section varies or the second section varies.

12. The extraction plate assembly of claim 11, wherein the channel width of the second section is constant.

13. The extraction plate assembly of claim 11, wherein the first section is conically shaped, and wherein the second section is cylindrically shaped.

14. The extraction plate assembly of claim 9, wherein one or more channels of the plurality of channels comprises a cross channel extending across the lengthwise axis.

15. A method of controlling neutral reactive species, comprising:
   generating a plasma within a plasma chamber of a plasma source; and
   coupling an extraction plate to a chamber housing of the plasma chamber, the extraction plate comprising:
      a main body having a first side positioned within the chamber housing and a second side positioned external to the chamber housing; and
      a plurality of channels extending through the main body, wherein each of the plurality of channels has a lengthwise axis oriented at a non-zero angle relative to a perpendicular extending from a main surface of a workpiece; and
   delivering, through the plurality of channels of the extraction plate, one or more radical beams to the workpiece at the non-zero angle, wherein each channel of the plurality of channels has a channel length and a channel width, and wherein at least one channel of the plurality of channels has width that varies along the channel length.

16. The method of claim 15, further comprising decreasing the channel width between an entrance and an exit of the at least one channel of the plurality of channels.

17. The method of claim 15, further comprising orientating the extraction plate at the non-zero angle, wherein the one or more radical beams include oxygen radicals.

18. The method of claim 15, further comprising etching a 3D structure of the workpiece using the one or more radical beams.

19. The method of claim 18, wherein etching the 3D structure of the workpiece using the one or more radical beams removes a bridge defect extending across a layer opening.

20. The method of claim 15, further comprising providing a cross channel extending perpendicular to the lengthwise axis of the at least one channel of the plurality of channels.

* * * * *